(12) United States Patent
Nguyen et al.

(10) Patent No.: US 6,556,021 B1
(45) Date of Patent: Apr. 29, 2003

(54) DEVICE FREQUENCY MEASUREMENT SYSTEM

(75) Inventors: Son Truong Nguyen, San Jose, CA (US); Lamberto de Mateo Beleno, Jr., Milpitas, CA (US); Sudhakar R. Gouravaram, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 135 days.

(21) Appl. No.: 09/725,631

(22) Filed: Nov. 29, 2000

(51) Int. Cl.[7] .............................................. G01R 31/00
(52) U.S. Cl. ..................... 324/537; 324/158.1; 324/765
(58) Field of Search .............................. 324/537, 158.1, 324/763, 765, 73.1, 76.39, 76.48

(56) References Cited

U.S. PATENT DOCUMENTS

| | | | | |
|---|---|---|---|---|
| 4,038,648 A | * | 7/1977 | Chesley | 324/73.1 X |
| 4,689,792 A | * | 8/1987 | Traynor | 371/38 |
| 4,713,605 A | * | 12/1987 | Iyer et al. | 324/73.1 |
| 5,065,090 A | * | 11/1991 | Gheewala | 324/73.1 |
| 5,099,196 A | * | 3/1992 | Longwell et al. | 324/537 |
| 5,457,400 A | * | 10/1995 | Ahmad et al. | 324/763 |
| 5,818,250 A | * | 10/1998 | Yeung et al. | 324/763 |
| 5,838,163 A | * | 11/1998 | Rostoker et al. | 324/763 |
| 6,157,201 A | * | 12/2000 | Leung, Jr. | 324/760 |
| 6,255,836 B1 | * | 7/2001 | Schwarz et al. | 324/763 |

* cited by examiner

*Primary Examiner*—N. Le
*Assistant Examiner*—T. R. Sundaram
(74) *Attorney, Agent, or Firm*—Luedeka, Neely & Graham, PC

(57) ABSTRACT

A method of testing semiconductor devices on a wafer, including a tasting circuit formed on the wafer for providing an output signal indicative of at least one operational characteristic of the devices. The output signal provided by the testing circuit is compatible for monitoring using an integrated circuit tester. The testing circuit includes an oscillator, an N-bit counter, and an N-bit shift register, all formed on the semiconductor wafer. The tester resets the counter and enables the oscillator, at which time the oscillator produces oscillator pulses at an oscillator frequency. During a predetermined time period, the counter receives and counts the oscillator pulses from the oscillator, and produces a pulse count corresponding to the number of oscillator pulses received. The shift register receives the count from the counter as an N-bit digital data word. The tester shifts the N number of bits of the digital data word out of the shift register, and manipulates the bits to determine a count value. The tester then determines an oscillator frequency value by dividing the count value by a time value corresponding to the predetermined time period.

11 Claims, 3 Drawing Sheets

US 6,556,021 B1

DEVICE FREQUENCY MEASUREMENT SYSTEM

FIELD

This invention relates to the field of testing of mass-produced semiconductor device. More particularly the invention relates to measuring a characteristic of a test device on a semiconductor chip to determine the performance of other devices on the chip.

BACKGROUND

Process monitor circuits are used in semiconductor manufacturing processes to monitor, at various points during production, whether the processes are producing semiconductor devices on a very large scale integrated (VLSI) circuit chip that perform according to specification. Monitoring is typically done by measuring the characteristics of the monitor circuit that are related to the process conditions used to fabricate the integrated circuits on a monolithic wafer. The process monitor circuits may be placed within every one of the production circuits, or dice, produced. In this manner, the process monitor circuit in each packaged device can be used as a data point to determine process characteristics.

One type of process monitor circuit is an oscillator circuit manufactured as part of the production integrated circuit wafer. When the oscillator circuit is excited, its oscillation frequency gives an indication of the performance of transistor devices in the oscillator circuit, and of the performance of other devices on the wafer.

Most VLSI circuit testers are not capable of monitoring an oscillator frequency directly. Thus, to measure oscillator frequency, integrated circuit manufacturers have had to resort to building expensive mixed-signal testers implemented in a "rack-and-stack" test equipment format.

What is needed, therefore, is a testing circuit on the production chip that provides an oscillator frequency output signal that may be monitored by a standard VLSI circuit tester.

SUMMARY

The above and other needs are met by a testing circuit formed on a semiconductor wafer that provides an output signal indicative of at least one operational characteristic of semiconductor devices formed on the wafer. The output signal provided by the testing circuit is compatible for monitoring using an integrated circuit tester. The testing circuit includes an oscillator, a counter, and a shift register, all formed on the semiconductor wafer. The oscillator produces oscillator pulses at an oscillator frequency when the oscillator is energized, where the oscillator frequency is indicative of at least one operational characteristic of the semiconductor device. The counter receives and counts the oscillator pulses from the oscillator, and produces a count corresponding to the number of oscillator pulses received by the counter during a predetermined length of time. The shift register receives the count from the counter as a digital data word comprising multiple bits.

In another aspect, the invention provides a system for determining at least one operational characteristic of semiconductor devices formed on a semiconductor wafer. The system includes an oscillator formed on the semiconductor wafer for producing oscillator pulses at an oscillator frequency when the oscillator is enabled, where the oscillator frequency is indicative of at least one operational characteristic of the semiconductor devices. The system also includes a counter formed on the semiconductor wafer for receiving and counting the oscillator pulses from the oscillator, and for producing a count corresponding to the number of oscillator pulses received by the counter during a predetermined length of time. A shift register formed on the semiconductor wafer receives the count from the counter as a digital data word comprising multiple bits. The system further includes a tester for receiving the count from the shift register, for determining the oscillator frequency based on the count and the predetermined time period, and for determining the at least one operational characteristic of the semiconductor devices based on the oscillator frequency.

In a most preferred embodiment, the tester is operable to reset the counter, enable the oscillator to begin producing the oscillator pulses, disable the oscillator after a predetermined time period, shift out the multiple bits of the count from the shift register, and determine the oscillator frequency based upon the multiple bits of the count and the predetermined time period.

In yet another aspect, the invention provides a method for testing a semiconductor device to determine at least one operational characteristic of the semiconductor device. The method includes resetting an N-bit counter, enabling an oscillator on the semiconductor device to produce oscillator pulses at an oscillator frequency during a predetermined time period, and counting the oscillator pulses with the counter during the predetermined time period to determine a pulse count. The method also includes producing a digital data word comprising N number of bits corresponding to the pulse count, and shifting the N number of bits of the digital data word into a shift register having a most significant bit and a least significant bit. The N number of bits of the digital data word are shifted out of the shift register, and are manipulated to determine a count value. The method further includes determining an oscillator frequency value by dividing the count value by a time value corresponding to the predetermined time period.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
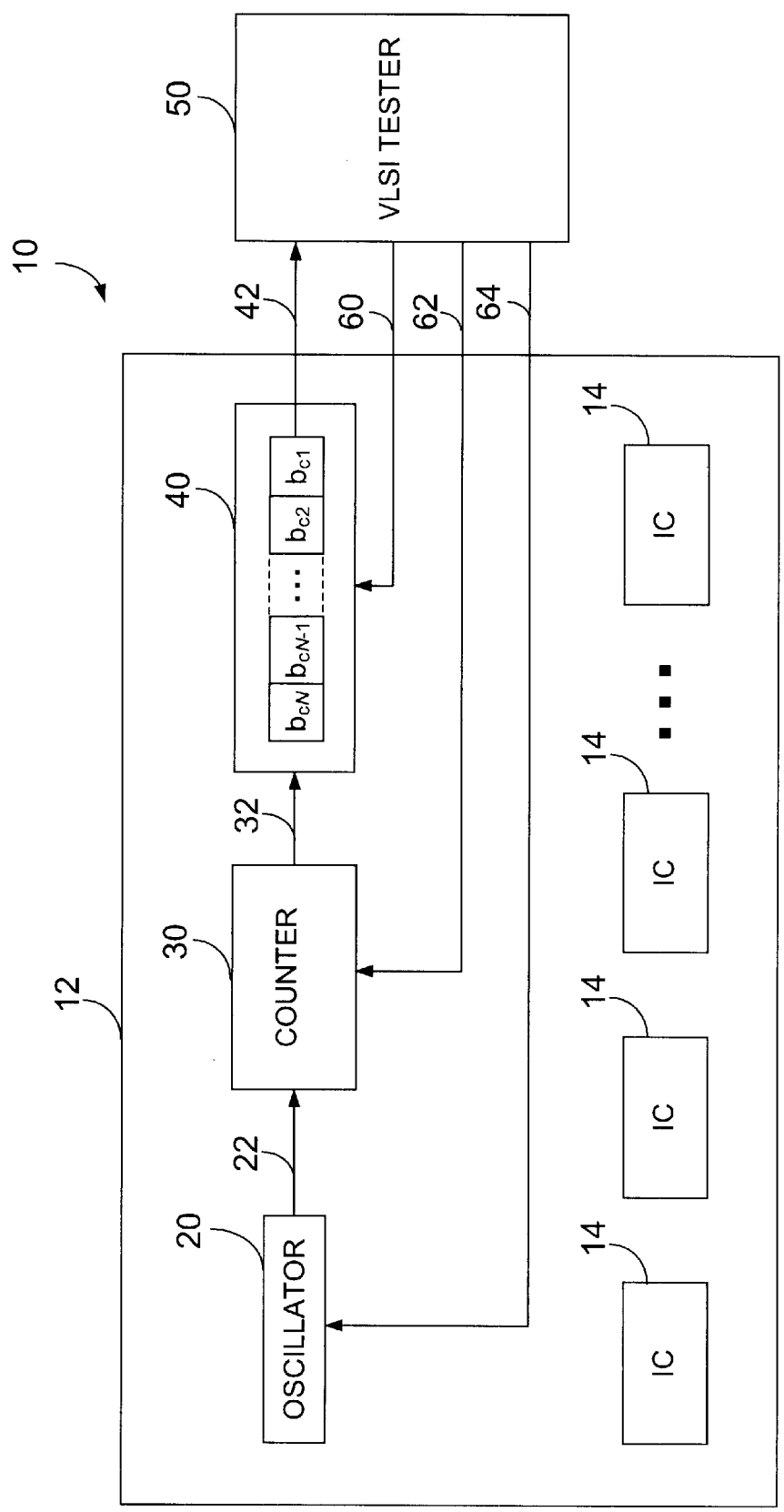
FIG. 1 is a functional block diagram of a preferred embodiment of a testing circuit according to the present invention.

FIG. 1 depicts a functional block diagram of a testing circuit 10 according to a preferred embodiment of the invention. The major elements of the circuit 10 include an oscillator 20, a counter 30, and a shift register 40. The function of each of these elements will be explained in greater detail below, as well as their construction and how they interact with one another. In the following discussion, an electrically conductive path from one element to another is referred to as a line. However, it will be appreciated that in the various embodiments, one or more electrical paths may be utilized where only a single line is depicted in the drawings.

The testing circuit 10 is preferably formed on a semiconductor wafer 12, along with many production integrated circuits 14, preferably using the same methods and processes of formation as those used to create the integrated circuits 14. In this manner, when the testing circuit 10 is analyzed, the results provide an indication of how the production integrated circuits 14 will function under similar circumstances. Thus, the invention provides an effective digital process monitor circuit.

The testing circuit 10 receives input from, and provides output to a test apparatus, such as a tester 50. The tester 50 may be a dedicated tester having only the capability to perform the functions described hereafter, or more preferably is a programmable tester capable of performing the described functions in conjunction with many other functions. Testers such as models Vista Logic, Logic 100, or SC212 manufactured by Credence, Inc., or model J-921 manufactured by Teradyne, Inc., and other similar testers known in the art, are acceptable for the functions described herein.

The input and output lines mentioned above will be briefly described here, and then their functions will be more fully explained hereafter. The oscillator 20 receives an enable signal from the tester 50 on line 64, the counter 30 receives a reset signal on the line 62, and the shift register 40 receives a shift signal on line 60. The output of the oscillator 20 is preferably provided to the counter 30 on the line 22, the output of the counter 30 is preferably provided to the shift register 40 on the line 32, and the output of the shift register 40 is preferably provided to the tester 50 on the line 42.

In the preferred embodiment, the oscillator 20 is a ring oscillator consisting of strings of CMOS devices. When enabled, such as by being energized, the oscillator 20 generates pulses at an oscillator frequency which is dependent on and proportional to the switching speed of the gates of the CMOS devices that comprise the oscillator 20. An example of such a ring oscillator is described in U.S. Pat. No. 5,867,033, the contents of which are incorporated herein by reference.

The measurement of the oscillator frequency is preferably commenced by resetting the counter 30 to zero by providing an input on line 62. By thus initializing the counter 30, the circuit 10 is prepared to start the digital counting process that forms the basis of the method. Next, the oscillator 20 preferably receives the enable signal from the tester 50 on the line 64, where the enable signal persists for a predetermined period of time. Upon receipt of the enable signal, the oscillator 20 begins generating alternating high and low logic signals, or pulses, at the oscillator frequency on the line 22. The oscillator continues generating the pulses during the predetermined period of time.

The counter 30 receives and counts the pulses on the line 22. In the preferred embodiment, the counter 30 is a ripple counter having ten bits. However, it will be appreciated that the counter 30 could be any other type of digital counter having any number of bits, where the number of bits define the resolution of the counter.

As mentioned previously, the enable signal on the line 64 provided to the circuit 10 only lasts for a predetermined length of time, during which the pulses produced by the oscillator 20 are counted by the counter 30. At the end of this predetermined length of time, the enable signal is curtailed, at which point the counter 30 has preferably not been overrun. If the counter 30 has been overrun, because, for example, the advance of process technology has made the CMOS gates of oscillator 20 switch faster than when the circuit was originally designed, then an enable signal having a shorter predetermined duration can be supplied on line 64, thereby allowing the oscillator 20 less time in which to cycle, and producing fewer pulses on line 22. Alternately, the counter 30 could be redesigned to have a higher capacity. Adding one bit to counter 30 would double its capacity. The ability to double the capacity of the counter 30 by merely adding one bit provides the circuit 10 with an enormous ability to adapt to faster gate speeds without a commensurately enormous addition of circuit elements.

As described in more detail hereinafter, the output from the counter 30, that is, the number of pulses counted during the predetermined period, is provided in the form of a digital data word on the line 32 to the shift register 40. The shift register 40, which preferably has a resolution of the same number of bits as the counter 30, receives the pulse count word, and shifts the bits of the word out to the tester 50 on the line 42. The shift register 40 shifts out the bits based on the shift signal received on the line 60.

Under the control of a software algorithm described below, the tester 50 determines a pulse count value based on the bits shifted out of the shift register 40, and divides the pulse count value by the predetermined time period to determine the oscillator frequency. The oscillator frequency can then be compared to tolerance limits related to the design of the specific production integrated circuits 14 located on the wafer 12 with the process monitor circuit 10. For example, if the oscillator frequency is below a first specified value, or above a second specified value, the wafer 12 could be scrapped. However, if the oscillator frequency is between the first and second specified values, then passing the semiconductor devices 14 on the wafer 12, such as by further processing, could be accomplished.

In this manner, the tester 50 may be used to determine the oscillator frequency, and thus the performance of the devices 14 on the wafer 12, without directly measuring the oscillator frequency. Therefore, there is no need for a rack of specialized test equipment dedicated to directly measuring the oscillator frequency.

According to a preferred embodiment of the present invention, the testing circuit 10 preferably uses only a single output line 42 and three input lines 60, 62, and 64 for determining the exact frequency of operation of the oscillator 20. Because of the small number of connection lines used in implementing the testing circuit 10, the testing circuit 10 does not unduly compete with the production circuits 14 for pin-outs in the finished package, and thus may be readily integrated within a semiconductor device 14, such as a CMOS device.

Figure 2:
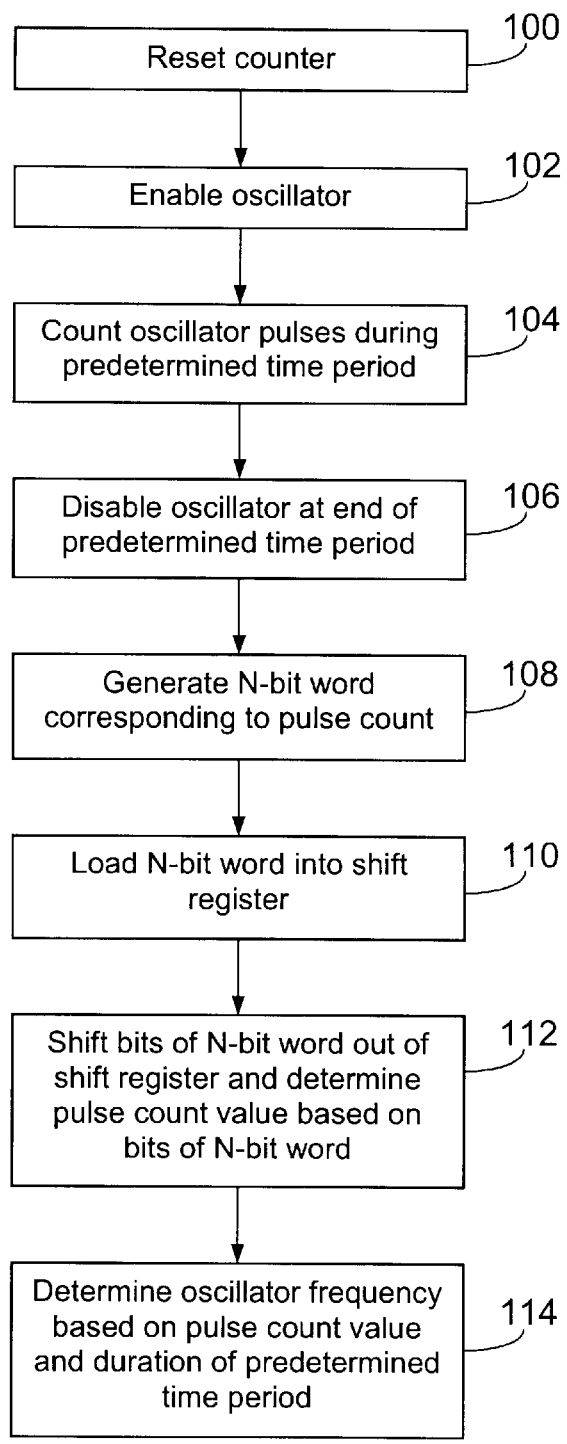
FIG. 2 is a flow chart depicting a preferred embodiment of a method according to the present invention.
Figure 3:
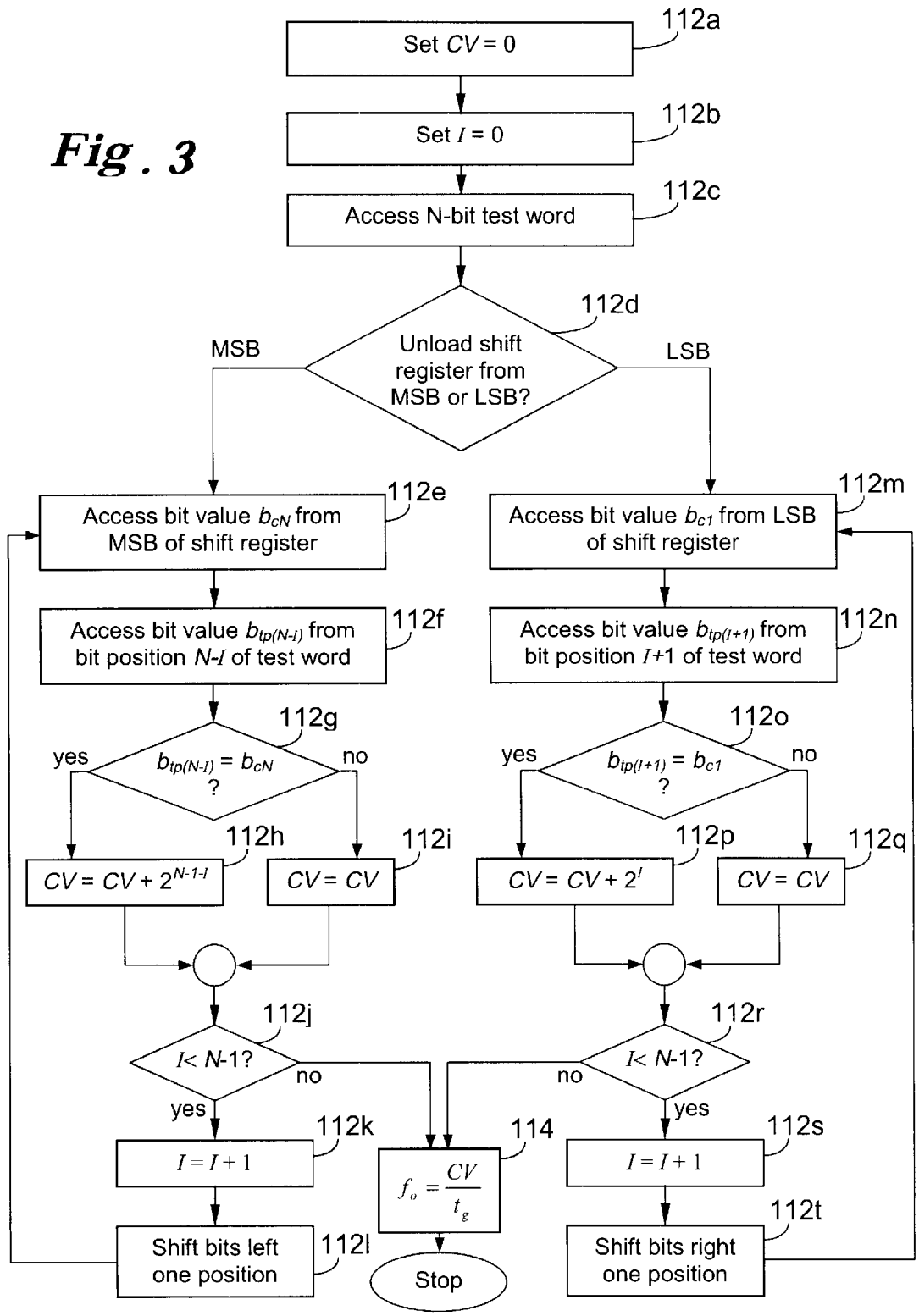
FIG. 3 is a flow chart depicting further detail of a preferred embodiment of a method according to the present invention.

With reference to FIGS. 2 and 3, a preferred method of operation of the tester 50 will be described. The tester 50 sets the reset signal high on the reset line 62 to reset (zero) the counter 30 (step 100). The oscillator 20 is energized and begins producing pulses on the line 22, when the enable signal from the tester 50 is provided on the enable line 64 (step 102). During the predetermined time period of duration $t_g$, the counter 30 counts the oscillator pulses (step 104). In the preferred embodiment, the tester 50 de-energizes the oscillator 20 at the completion of the predetermined period of time, preferably by removing the enable signal from the enable line 64 (step 106).

In a most preferred embodiment, the oscillator 20 is energized and allowed to stabilize before the tester 50 enables the counter 30 to count the oscillator pulses for the predetermined period of time. Then, at the end of the predetermined period of time, the tester 50 disables the counter 30 from counting any more of the oscillator pulses. Thus, in this most preferred embodiment, the oscillator 20 is able to stabilize at a given rate prior to commencement of the time period during which the counter 30 counts the oscillator pulses.

The counter 30 generates an N-bit word representing the number of pulses counted during the predetermined time period (step 108). This N-bit pulse count word is loaded into the shift register 40, preferably serially (step 110). However, it should be appreciated that the bits of the pulse count word could also be loaded into the register 40 in parallel. The tester 50 shifts the N number of bits of the pulse count word out of the shift register 40, determines the pulse count value based thereon (step 112), and determines the oscillator frequency based on the pulse count value and the length of the predetermined period of time (step 114).

The preferred process performed by the tester 50 to shift the bits out of the shift register 40 and to determine the count value is depicted in FIG. 3. The pulse count value, CV, and an index value, I, are first set to zero (steps 112a and 112b). An N-bit test pattern word is accessed from memory in the tester 50 (step 112c). In the preferred embodiment, and in the example provided below, all of the bits $b_{tpN}$ of the test pattern word are set high; that is, bits $b_{tp1}$, through $b_{tpN}$, are all set to one. Alternately bits $b_{tp1}$ through $b_{tpN}$ are all set to zero, with the method as described below changed appropriately to account for the different initial value of the bits.

Preferably, the tester 50 can unload the shift register 40 from the most significant bit (MSB) or from the least significant bit (LSB), depending at least in part upon the configuration of the testing circuit 10. A value indicating the unloading mode may be stored as a configuration parameter in the tester memory, or may be selected by the operator of the tester 50 when so prompted during execution of the tester software (step 112d).

If the shift register 40 is to be unloaded from the MSB, the tester 50 shifts out the bit value $b_{cN}$ (step 112e), and accesses the bit value $b_{tp(N-I)}$ from the bit position N-I in the test pattern word (step 112f). If $b_{tp(N-I)}$ equals $b_{cN}$ (step 112g), such as may be determined by an AND operation, the count value is determined at step 112h according to:

$$CV = CV + 2^{N-1-I}. \quad (1)$$

If $b_{tp(N-I)}$ does not equal $b_{cN}$ (step 112g), the count value remains unchanged (step 112i).

If I is less than N-1 (step 112j), I is incremented by one (step 112k), and the tester 50 provides the shift signal on the shift line 60 to shift the bits of the pulse count word by one bit position to the left in the register 40 (step 112l). The process then loops back to step 112e to shift out the next bit from the MSB position, and the process continues until I is not less than N-1.

If I is not less than N-1 at step 112j, the tester 50 then determines the oscillator frequency, $f_o$, at step 114 according to:

$$f_o = \frac{CV}{t_g}. \quad (2)$$

If the shift register 40 is to be unloaded from the LSB (as depicted in FIG. 1), the tester 50 shifts out the bit value $b_{c1}$ from the pulse count word (step 112m), and accesses the bit value $b_{tp(I+1)}$ from the bit position I+1 in the test pattern word (step 112n). If $b_{tp(I+1)}$ equals $b_{c1}$ (step 112o), the count value is determined at step 112p according to:

$$CV = CV + 2^I. \quad (3)$$

If $b_{tp(I+1)}$ doe not equal $b_{c1}$ (step 112o), the count value remains unchanged (step 112q).

If I is less than N-1 (step 112r), I is incremented by one (step 112s), and the tester 50 provides the shift signal on the shift line 60 to shift the bits of the pulse count word by one bit position to the right in the register 40 (step 112t). The process then loops back to step 112m to shift out the next bit from the LSB position, and the process continues until I is not less than N-1.

For an example of the operation of the tester 50 according to the process depicted in FIG. 3, consider a situation where N is four, the pulse count word in the shift register 40 is 1101 ($b_{c4}=1$, $b_{c3}=1$, $b_{c2}=0$, $b_{c1}=1$), and the test pattern word is 1111 ($b_{tp4}=1$, $b_{tp3}1$, $b_{tp2}=1$, $b_{tp1}=1$). Table I indicates the values of CV for each pass through the loop as the shift register 40 is unloaded from the MSB, and Table II indicates the values of CV for each pass through the loop as the shift register 40 is unloaded from the LSB.

TABLE I

| I | $b_{cN}$ | $b_{tp(N-I)}$ | CV |
|---|---|---|---|
| 0 | 1 | 1 | 8 |
| 1 | 1 | 1 | 12 |
| 2 | 0 | 1 | 12 |
| 3 | 1 | 1 | 13 |

TABLE II

| I | $b_{cI}$ | $b_{tp(I+1)}$ | CV |
|---|---|---|---|
| 0 | 1 | 1 | 1 |
| 1 | 0 | 1 | 1 |
| 2 | 1 | 1 | 5 |
| 3 | 1 | 1 | 13 |

To continue with this example, if the predetermined time period, $t_g$, during which the thirteen pulses are counted is one millisecond, the oscillator frequency is:

$$f_o = \frac{CV}{t_g} = \frac{13}{.001} = 13,000 \text{ Hz}.$$

As described in the foregoing, the counter 30 and shift register 40 of the preferred embodiment of the invention are located on the same semiconductor wafer 12 as the oscillator 20 and the semiconductor devices 14. However, one skilled in the art will appreciate that the counter 30 and register 40 could be located on a test board that is separate from the wafer 12. Alternatively, the counter 30 and register 40 could be integrated into the tester 50. Thus, as indicated by the appended claims, the invention is not limited to any particular location of the counter 30 or the register 40.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for testing a semiconductor device to determine at least one operational characteristic of the semiconductor device, comprising:

(a) resetting an N-bit counter;
   (b) enabling an oscillator on the semiconductor device to produce oscillator pulses at an oscillator frequency during a predetermined time period;
   (c) counting the oscillator pulses with a counter during the predetermined time period to determine a pulse count;
   (d) producing a digital data word comprising N number of bits corresponding to the pulse count;
   (e) shifting the N number of bits of the digital data word into a shift register having at least a most significant bit and a least significant bit;
   (f) shifting the N number of bits of the digital data word out of the shift register, and manipulating the N number of bits of the digital data word to determine a count value; and
   (g) determining an oscillator frequency value by dividing the count value by a time value corresponding to the predetermined time period.

2. The method of claim 1 wherein step (f) further comprises:

(f1) setting the count value, CV, equal to zero;
   (f2) setting an index value, I, equal to zero;
   (f3) accessing a predetermined test word having N bits;
   (f4) determining a bit value, $b_{cN}$, of the most significant bit of the shift register;
   (f5) determining a bit value, $b_{tp(N-I)}$, of bit position N–I of the test pattern, where bit position N is the most significant bit, and bit position 1 is the least significant bit of the test pattern;
   (f6) comparing $b_{cN}$ to $b_{tp(N-I)}$;
   (f7) determining the count value according to:

$CV=CV$, when $b_{tp(N-I)} \neq b_{cN}$, or $CV=CV+2^{N-1-I}$, when $b_{tp(N-I)}=b_{cN}$;

(f8) if I<N–1, incrementing I by one;
   (f9) if I<N–1, shifting the bits of the digital data word in the shift register by one bit position in the direction of the most significant bit; and
   (f10) repeating steps (f4)–(f9) N–1 times.

3. The method of claim 2 wherein step (g) further comprises determining the oscillator frequency value according to:

$$f_o = \frac{CV}{t_g},$$

where $f_o$ is the oscillator frequency value and $t_g$ is the time value corresponding to the predetermined time period.

4. The method of claim 1 wherein step (f) further comprises:

(f1) setting the count value, CV, equal to zero;
   (f2) setting an index value, I, equal to zero;
   (f3) accessing a predetermined test word having N bits;
   (f4) determining a bit value, $b_{c1}$, of the least significant bit of the shift register;
   (f5) determining a bit value, $b_{tp(I+1)}$, of bit position I+1 of the test pattern, where bit position N is the most significant bit, and bit position 1 is the least significant bit of the test pattern;
   (f6) comparing $b_{c1}$ to $b_{tp(I+1)}$;
   (f7) determining the count value according to:

$CV=CV$, when $b_{tp(I+1)} \neq b_{c1}$, or $CV=CV+2^I$, when $b_{tp(I+1)}=b_{c1}$, (f8) if I<N–1, incrementing I by one;
   (f9) if I<N–1, shifting the bits of the digital data word in the shift register by one bit position in the direction of the least significant bit; and
   (f10) repeating steps (f4)–(f9) N–1 times.

5. The method of claim 4 wherein step (g) further comprises determining the oscillator frequency value according to:

$$f_o = \frac{CV}{t_g},$$

where $f_o$ is the oscillator frequency value and $t_g$ is the time value corresponding to the predetermined time period.

6. The method of claim 1 further comprising scrapping the semiconductor device when the oscillator frequency value is below a first specified frequency value or above a second specified frequency value.

7. The method of claim 6 further comprising passing the semiconductor device when the oscillator frequency value is between the first and second specified frequency values.

8. The method of claim 1 wherein the oscillator further comprises a ring oscillator.

9. The method of claim 1 wherein the counter further comprises a ripple counter.

10. The method of claim 1 wherein the counter and shift register are disposed on the semiconductor device with the oscillator.

11. The method of claim 1 further comprising using an integrated circuit tester to reset the counter, enable the oscillator to begin producing the oscillator pulses, disable the oscillator after the predetermined time period, shift out the bits of the digital data word from the shift register, and determine the oscillator frequency based upon the bits of the digital data word and the predetermined time period.

* * * * *